United States Patent [19]
Katakura et al.

[11] Patent Number: 5,999,462
[45] Date of Patent: Dec. 7, 1999

[54] CLOCK GENERATION CIRCUIT FOR ANALOG VALUE MEMORY CIRCUIT

[75] Inventors: Masayuki Katakura; Masashi Takeda, both of Kanagawa, Japan

[73] Assignee: Sony Corporation, Japan

[21] Appl. No.: 09/205,200

[22] Filed: Dec. 4, 1998

Related U.S. Application Data

[62] Division of application No. 08/808,866, Feb. 28, 1997.

[30] Foreign Application Priority Data

Mar. 14, 1996 [JP] Japan .................................. P08-057299
Mar. 19, 1996 [JP] Japan .................................. P08-062255

[51] Int. Cl.$^6$ ............................................. G11C 7/00
[52] U.S. Cl. ............................ 365/194; 365/45; 348/748
[58] Field of Search ........................... 365/194, 45, 240; 331/25; 348/748, 233

[56] References Cited

U.S. PATENT DOCUMENTS 4,271,488  6/1981  Saxe ........................................ 365/240
4,536,795  8/1985  Hirota et al. .............................. 348/106
5,206,726  4/1993  Okuda ....................................... 348/149

*Primary Examiner*—David Nelms
*Assistant Examiner*—Hoai V. Ho
*Attorney, Agent, or Firm*—Ronald P. Kananen; Rader, Fishman & Grauer

[57] ABSTRACT

An analog delay circuit which includes an analog memory circuit wherein a plurality of memory cells each including a memory capacitor and a selection switch for the memory capacitor are arranged in a matrix includes row switches provided for the individual columns for individually being driven by row selection signals. A same clock signal from a clock generation circuit is supplied commonly to an X direction scanning circuit and a Y direction scanning circuit. The number of stages of registers of the X direction scanning circuit and the number of stages of registers of the Y direction scanning circuit are set so that they have no common divisor other than 1. Consequently, when the memory cells are to be selectively scanned, a same selection condition can be provided to all of the memory cells without relying upon the positions of the memory cells, and the parasitic capacitance connected to a signal write/read terminal is reduced.

3 Claims, 13 Drawing Sheets

81 X DIRECTION SCANNING CIRCUIT
82 Y DIRECTION SCANNING CIRCUIT

81 X DIRECTION SCANNING CIRCUIT
82 Y DIRECTION SCANNING CIRCUIT

CLOCK GENERATION CIRCUIT FOR ANALOG VALUE MEMORY CIRCUIT

This application is a divisional of application Ser. No. 08,808,866 filed Feb. 28, 1997.

BACKGROUND OF THE INVENTION

1. Field of the Invention

This invention relates to an analog delay circuit and a clock generation circuit for use with an analog delay circuit, and more particularly to an analog delay circuit which delays an analog signal by repetitively performing writing/reading of information in a predetermined write/read cycle into and from memory capacitors of memory cells arranged two-dimensionally in a matrix and a clock generation circuit for use with an analog delay circuit.

2. Description of the Related Arts

A delay circuit for an analog signal is required to delay a color signal by 1 H (horizontal sweep period), for example, in a color signal demodulation circuit of a color television receiver of the PAL (Phase Alternation by Line) system. In particular, in the PAL system, since a modulated signal from two color signals is transmitted reversing the polarity thereof for each one scanning line, the color signal demodulation circuit requires a 1 H delay time in order to establish line correlation. The analog delay circuit has, for example, such a circuit construction as shown in FIG. 1.

Referring to FIG. 1, a write switch S1 and a read switch S2 are connected in series between a circuit input terminal 6 and the inverting (−) input terminal of an operational amplifier A1. The non-inverting (+) input terminal of the operational amplifier A1 is grounded, and the output terminal of the operational amplifier A1 is connected to a circuit output terminal 7, and a read capacitor Co and a reset switch S3 are connected in parallel between the inverting input terminal and the output terminal of the operational amplifier A1. Further, N selection switches S(N) and N memory capacitors C(n) are connected between a junction P of the switches S1 and S2 and the ground.

FIG. 2 is a timing chart of operations of the switches S1 to S3. Referring to FIG. 2, within a period T1, the write switch S1 and the reset switch S3 are open and the read switch S2 is closed, and consequently, charge of the nth memory capacitor C(n) is transferred to the read capacitor Co. The charge in this instance is charge which was written during the immediate preceding cycle (N clocks). Within another period T2, the read switch S2 is open and the write switch S1 and the reset switch S3 are closed. The write switch S1 writes an input signal to the circuit input terminal 6 into the memory capacitors C(n), and the reset switch S3 resets the read capacitor Co. Similarly, within a further period T3, the charge of the memory capacitor C(n+1) is read out, and within a still further period T4, the input signal is written.

FIG. 3 is a diagrammatic view of the concept of an analog delay. Referring to FIG. 3, n memory capacitors Cn are arranged, and information written in the last cycle into the ith memory capacitor Ci is read out and then information in the present cycle is written into the memory capacitor Ci. Such operation is successively performed for Ci→Ci+1→ . . . →Cn and then for C1. Here, if the read/write cycle is represented by T, a delay of nT is produced between the written information and the read information. Therefore, a delay circuit for an analog signal can be realized in which the delay is a multiple of T.

FIG. 4 is a circuit diagram showing a detailed construction of an analog value memory circuit which includes memory capacitors C(n) and selection switches S(N). Referring to FIG. 4, memory cells formed from selection switches Smn and memory capacitors Cmn connected in series between row lines RLn and the ground are arranged in a matrix of u columns and v rows. The selection switches S11 to Su1, S12 to Su2, . . . , and S1v to Suv of the u·v memory cells are selectively controlled by column selection signals X1 to Xu outputted from an X direction scanning circuit 11 and row selection signals Y1 to Yv outputted from a Y direction scanning circuit 12.

Those selection switches S11 to Su1, S12 to Su2, . . . , S1v to Suv can be formed from MOSFETs, JFETs (junction type FETs) or bipolar transistors. A construction of memory cells of i columns and j rows where, for example, MOSFETs are used for the selection switches is shown in FIG. 5. Referring to FIG. 5, the anode of a diode Dij and a terminal of a resistor Rij are connected to the gate electrode of a MOSFET Qij serving as a selection switch. A column selection signal Xi is applied to the other terminal of the register Rij and a row selection signal Yj is applied to the cathode of the diode Dij, and only when both of the column selection signal Xi and the row selection signal Yj have a high potential, read/write from/into the memory cell Cij is enabled.

Operation waveforms of the circuit of FIG. 4 are shown in FIG. 6. Referring to FIG. 6, XCLK denotes a clock signal to be inputted to the X direction scanning circuit 11, YCLK denotes a clock signal to be inputted to the Y direction scanning circuit 12, X1 to Xu denote column selection signals, and Y1 to Y3 denote row selection signals. It is to be noted that the clock signal YCLK has a period equal to u times that of the clock signal XCLK, and within one cycle of the clock signal YCLK, reading/writing is performed from the first to the nth columns. After the one period comes to an end, the row for reading/writing changes from the jth row to the j+1th row, and then reading/writing is performed from the first to the uth columns similarly.

Here, operation for the jth row will be described with reference to a waveform diagram of FIG. 7. It is to be noted that enlarged waveforms of the row selection signal Yj and the column selection signals X1, X2 and Xu are shown in FIG. 7. First, for the memory cells in the first column, the column selection signal X1 and the row selection signal Y1 rise simultaneously. On the other hand, for the memory cells in the uth column, the column selection signal Xu and the row selection signal Yj fall simultaneously. For the memory cells in the second to (u−1)th columns, the row selection signal Yj is in a steady state, and a selection operation is performed only in response to the column selection signals X2 to Xu−1.

In other words, the first column, the uth column and the other columns are driven in different conditions from one another. Accordingly, the gate electrode waveform of the MOSFET Qij as the selection switch shown in FIG. 5 is not exactly same among the first row, the uth row and the other rows. This is because the column selection signals X1 to Xu and the row selection signals Y1 to Yv are delicately different in waveform or delay time and the diode Dij and the resistor Rij shown in FIG. 5 have parasitic capacitances and so forth.

FIG. 8 illustrates parasitic capacitances of a MOSFET in an example of the related arts wherein, for example, a MOSFET is used as a selection switch. Such parasitic capacitances Cgs, Cgd, Css and Cds as seen in FIG. 8 are present between the source and drain which are poles of the switch and the gate and a substrate (or well). Where those capacitances Cgs, Cgd, Css and Cds are very small with a single switch, a total value of parasitic capacitances of 100 to 1,000 switches amounts to 10 times or occasionally to 100 times the memory capacitors C(n). This problem similarly applies even where the switch element is formed from a JFET or a bipolar transistor although some difference is present in the structure in which the parasitic capacitances are formed.

Subsequently, it will be described what bad influence such parasitic capacitances have on the operation of an analog delay circuit. The influence of the parasitic capacitances vary a little depending upon the structure of the analog delay circuit and/or the type of switch elements, and this will be described below by way of an example of the circuit of FIG. 6. FIG. 9 shows an analog delay circuit which includes a single capacitor Cm and a single selection switch Sm in place of the N memory capacitors C(n) and selection switches S(N) of FIG. 6, respectively, and additionally includes a parasitic capacitance Cp.

The first problem resides in that, in a case wherein a charge written in the last cycle is read out is considered, an input voltage written immediately prior to that moment is stored in the parasitic capacitance Cp. As a result, the charge read out to the read capacitor Co is the sum of the original charge accumulated in the memory capacitor Cm and the charge accumulated in the parallel-connected parasitic capacitance Cp. The charge of the memory capacitor Cm has undergone a predetermined delay whereas the charge of the parasitic capacitance Cp has undergone little delay. Accordingly, the parasitic capacitance Cp gives rise to a side effect of leaking a signal free from a delay to the output.

One of possible countermeasures against the side effect is to control the individual switches at somewhat complicated timings to effect the desired compensation. In particular, it is required to prevent the side effect described above by performing such complicated timing control as to set a time for discharging the charge of the parasitic capacitance Cp by closing the reset switch S3 and the read switch S2 before the charge of the memory capacitor Cm is read out.

Another problem, which is more fatal, resides in that the settling time of the output is extended. Where the bandwidth of the operational amplifier A1 is represented by $\omega o$, the response time to a step input in a full feedback condition is $\tau = 1/\omega o$. However, if the parasitic capacitance Cp is present, then the feedback ratio $\beta$ is given by $$\beta = 1/(1+Cp/Co) \quad (1)$$

Thus, the bandwidth of the loop decreases to $\beta \omega o$ and also the time constant of the transient response changes to $\tau' = 1/\beta \cdot \tau$. Accordingly, if the capacitance value of the parasitic capacitance Cp is high, then this remarkably decreases the feedback ratio of the operational amplifier A1 when the charge accumulated in the memory capacitor Cm is read out, which makes high speed read out difficult. In order to eliminate this, the bandwidth of the operational amplifier A1 should be designed to be very wide. This, however, is not practical.

In the analog delay circuit of the related art described above, when the memory cells of the matrix are scanned to select them, since such raster scanning as scanning of a television signal is performed as indicated by the arrow marks in FIG. 10, where the gate electrode waveform of the MOSFET Qij is different among the first column, the uth column and the other columns, the difference in gate electrode waveform appears as a difference in gain of the input/output characteristics in writing/reading or in offset characteristic via parasitic capacitances of the MOSFETs or arising from delicate differences in conducting state. Or in other words, there is a problem that noise of a fixed pattern is produced.

By the way, in such an application, as an application of an analog delay circuit, wherein an echo is applied, for example, to an audio signal, a high degree of accuracy is not required for the delay time. On the other hand, in a color signal demodulation circuit for a color television receiver of the PAL system, a delay time which conforms exactly with a horizontal synchronizing period is required. An example of a construction of a clock generation circuit in such an application as just described is shown in FIG. 11.

Referring to FIG. 11, the clock generation circuit shown has a PLL (Phase LockedLoop) circuit construction which includes a voltage controlled oscillator 21, a divider 22 for dividing the oscillation frequency of the voltage controlled oscillator 21 to 1/u, a divider 23 for further dividing the division frequency of the divider 22 to 1/v, and a phase comparator 24 for comparing the phase of the division frequency of the divider 23 and a horizontal synchronizing frequency FH with each other and supplying the phase difference output thereof as a control input to the voltage controlled oscillator 21. The voltage controlled oscillator 21 is locked with an oscillation frequency equal to u×v times with reference to the horizontal synchronizing frequency FH to obtain a clock signal XCLK for the X direction scanning circuit 11, and the clock signal XCLK is divided to 1/u to Obtain a clock signal YCLK for the Y direction scanning circuit 12.

However, with the clock generation circuit of the construction described above, since a large number of counters are required to construct the PLL circuit, there is a problem that, where the clock generation circuit is formed into an IC, the counters occupy a large area of the chip or consume substantial current. Further, where the phase difference between the clock signal XCLK and the clock signal YCLK is large, this increases the fixed pattern noise mentioned above. In order to keep the phases of the two clock signals exactly, such a countermeasure as to form the dividers 22 and 23 from synchronous counters or to latch the outputted clock signals XCLK and YCLK to synchronize them is required.

SUMMARY OF THE INVENTION

It is an object of the present invention to provide an analog delay circuit wherein the influence of a parasitic capacitance is reduced to allow charge accumulated in a memory capacitor to be read out at a high speed.

It is another object of the present invention to provide an analog delay circuit wherein a same selection condition is applied to all memory cells without depending upon the positions of the memory cells to prevent production of fixed pattern noise.

It is a further object of the present invention to provide a clock generation circuit for a system employing a clock signal synchronized with an external reference signal wherein a PLL can be constructed without the necessity for such a circuit as a divider.

In order to attain the objects described above, according to an aspect of the present invention, there is provided an analog delay circuit, comprising an analog value memory circuit including a plurality of memory cells each including a switch element having a terminal connected to a corresponding row line and a memory capacitor connected to the other terminal of the switch element, the memory cells being arranged in a matrix of u columns and v rows, u and v being natural numbers, v row switches arranged for the individual columns and each connected at a terminal thereof to a common input/output node and at the other terminal thereof to a terminal of the corresponding row line, a first scanning circuit for outputting column selection signals for i columns to drive the switch elements of the memory cells for the individual columns, i being equal to or larger than 1 but equal to or smaller than u, and a second scanning circuit for outputting row selection signals for j rows to drive the switch elements of the memory cells and the row switches for the individual rows, j being equal to or larger than 1 but (equal to or smaller than v.

In the analog delay circuit of the construction described above, when both of the column selection signal for the ith column and the row selection signal for the jth row are rendered active, the memory cell in the ith column and the jth row of the analog value memory circuit is selected, and the switch element of the memory cell is put into a conducting (closed) state. Simultaneously, the row switch for the jth row is selected and put into a conducting state. In this selection condition, only the switch elements of the memory cells in the jth row are connected to the input/output node, and writing/reading out of charge is performed for that one of the memory capacitors of the memory cells of the jth row which is in the ith column.

According to another aspect of the present invention, there is provided an analog delay, circuit, comprising an analog value memory circuit including a plurality of memory cells each including a switch element having a terminal connected to a corresponding row line and a memory capacitor connected to the other terminal of the switch element, the memory cells being arranged in a matrix of u columns and v rows, u and v being natural numbers, a first scanning circuit for successively outputting u column selection signals to drive the switch elements of the memory cells for the individual columns, a second scanning circuit for successively outputting v row selection signals to drive the switch elements of the memory cells for the individual rows, and a clock generation circuit for supplying a same clock signal to the first and second scanning circuits, the numbers u and v of the first and second scanning circuits being set so as to have no common divisor other than 1.

In the analog delay circuit of the construction described above, the first and second scanning circuits are driven with the same clock frequency by the same clock signal. Further, since the numbers u and v of the first and second scanning circuits do not have a common divisor other than 1, the addresses in the two X and Y directions vary for each clock when the memory cells are to be selectively scanned. Consequently, not raster scanning, but scanning of all of the memory cells is performed in accordance with a certain rule. As a result, the column selection signal and the row selection signal have a one clock width for any of the memory cells and provide the same selection condition to all of the memory cells.

According to a further aspect of the present invention, there is provided a clock generation circuit for an analog delay circuit which includes an analog value memory circuit including a plurality of memory cells each including a switch element having a terminal connected to a corresponding row line and a memory capacitor connected to the other terminal of the switch element, the memory cells being arranged in a matrix of u columns and v rows, u and v being natural numbers, a first scanning circuit for successively outputting u column selection signals to drive the switch elements of the memory cells for the individual columns, and a second scanning circuit for successively outputting v row selection signals to drive the switch elements of the memory cells for the individual rows, the clock generation circuit supplying the same clock signal to the first and second scanning circuits, the clock generation circuit comprising a logic operation circuit for logically operating one of the column selection signals of the first scanning circuit and one of the row selection signals of the second scanning circuit, a phase comparator for comparing a phase of an output signal of the logical operation circuit and a phase of a reference signal provided from the output with each other, and a voltage controlled oscillator for receiving a comparison output of the phase comparator as a control input for an oscillation frequency and supplying a clock signal of the oscillation frequency commonly to the first and second scanning circuits.

In the clock generation circuit of the construction described above, one of the column selection signals of the first scanning circuit and one of the row selection signals of the second scanning circuit are logically operated, and the phase of the operation output signal is compared with the phase of an external reference signal by the phase comparator. Then the oscillation frequency of the voltage controlled oscillator for producing the clock signal common to the first and second scanning circuits is controlled in response to the phase difference. Consequently, the first and second scanning circuits act as a divider which divides the oscillation frequency of the voltage controlled oscillator.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENTS

Figure 1:
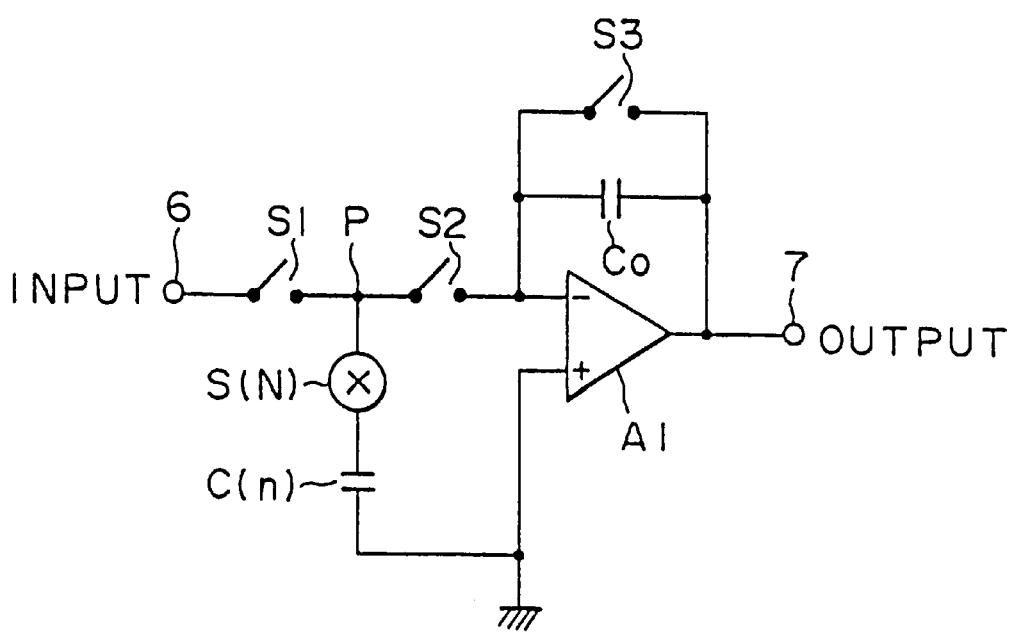
FIG. 1 is a circuit diagram showing a basic circuit construction of an analog delay circuit as a related art.
Figure 2:
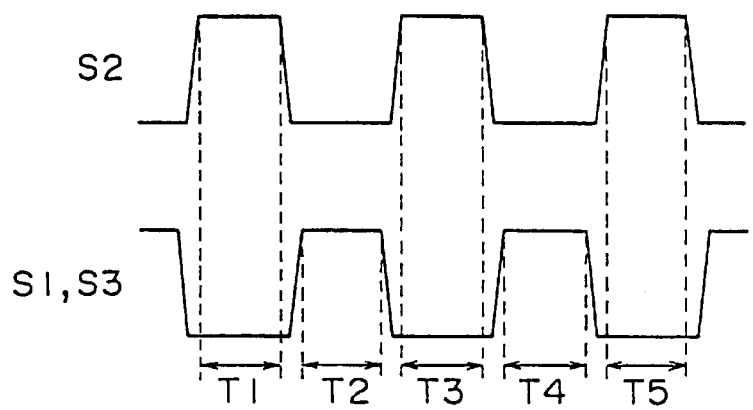
FIG. 2 is a timing chart of the operations of switches employed in the analog delay circuit of FIG. 1.
Figure 3:
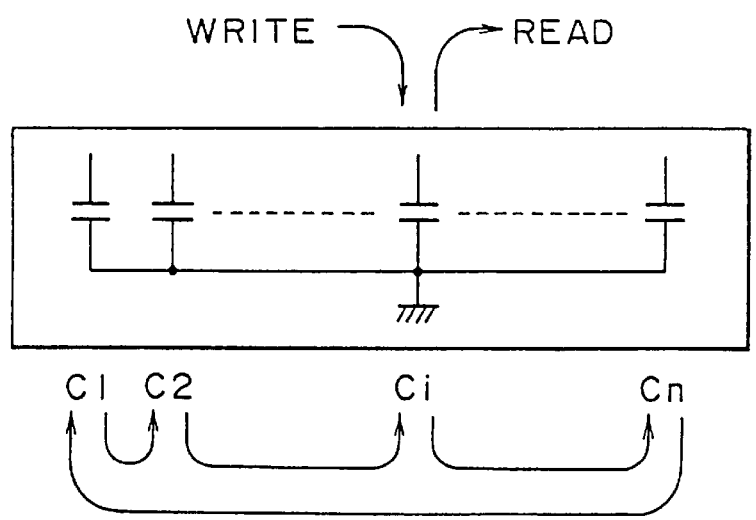
FIG. 3 is a diagrammatic view illustrating a concept of an analog delay.
Figure 4:
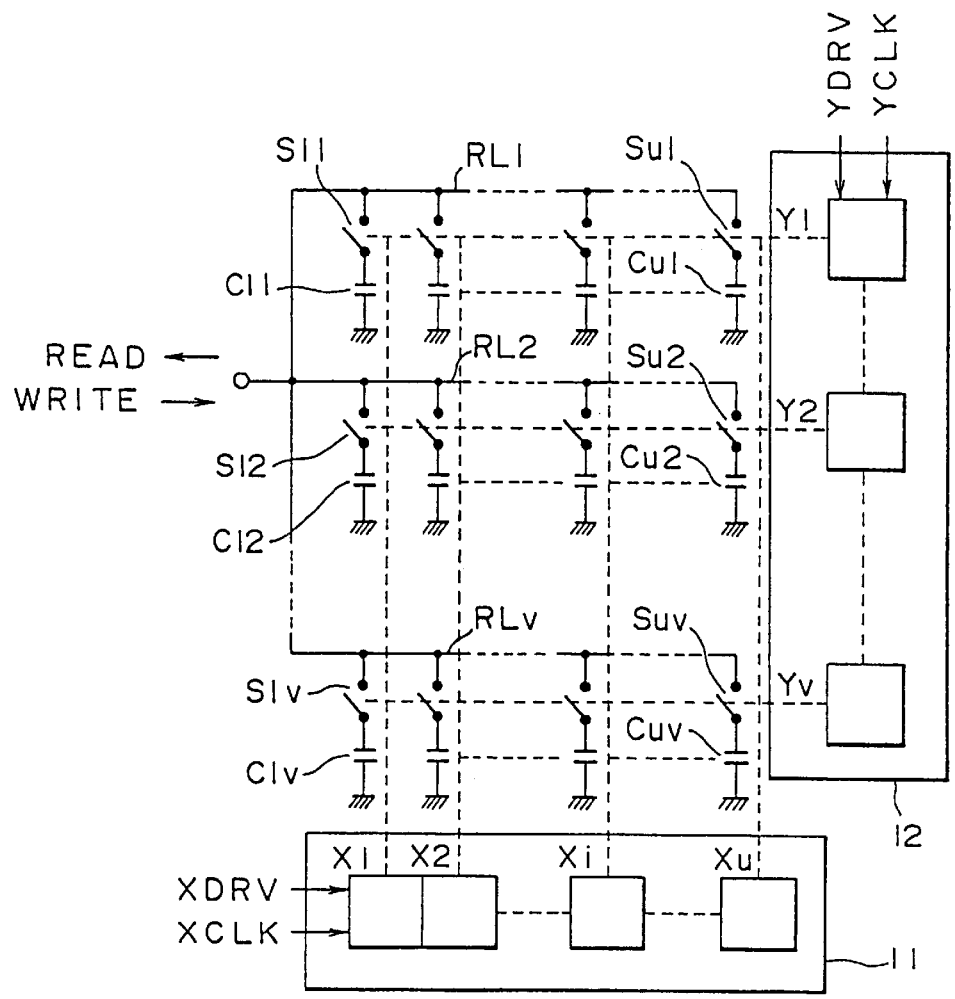
FIG. 4 is a circuit diagram showings a related art of an analog delay circuit.
Figure 12:
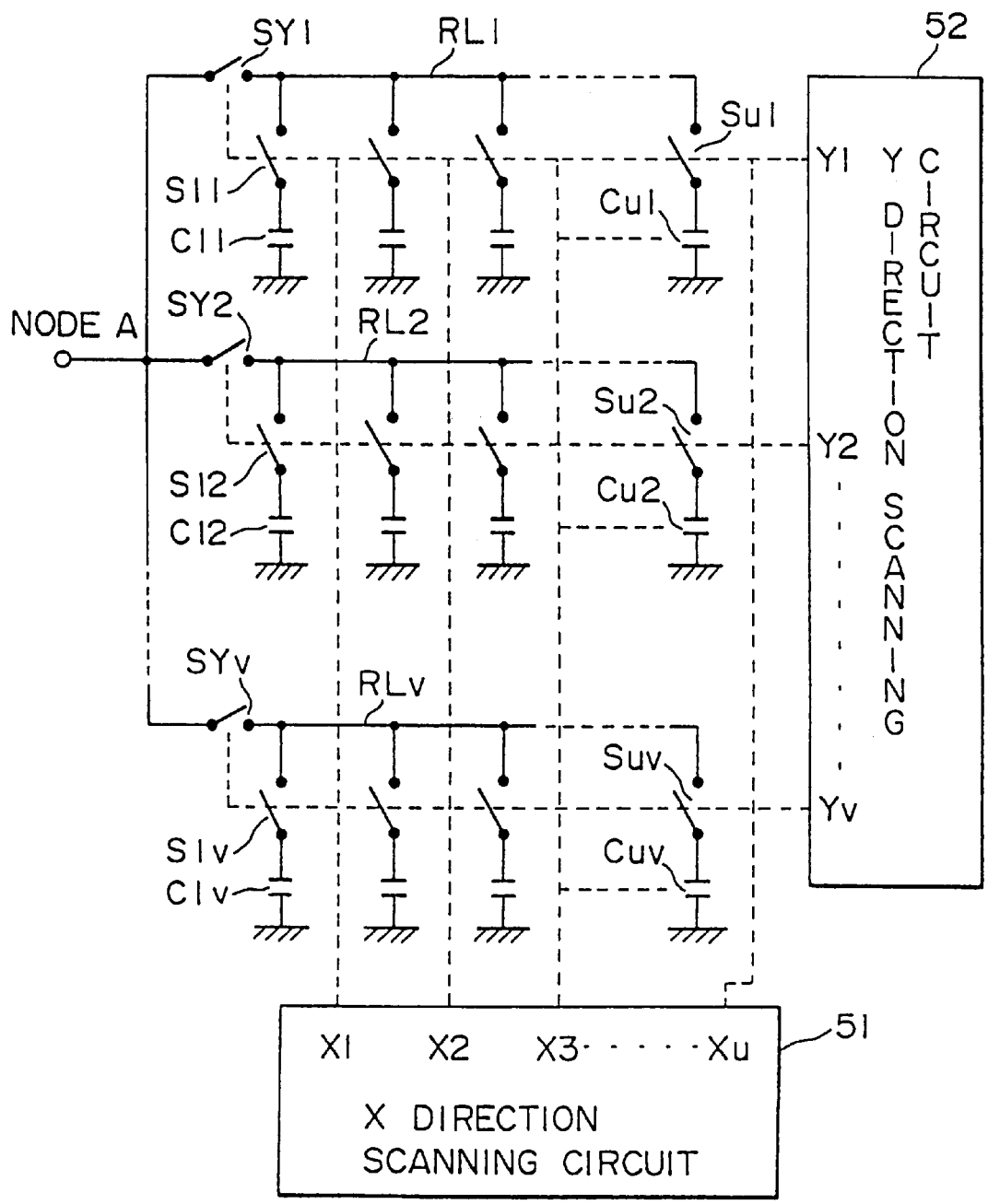
FIG. 12 is a circuit diagram of an analog memory delay circuit of a first preferred embodiment of the present invention.

In the following, preferred embodiments of the present invention will be described in detail with reference to the accompanying drawings. FIG. 12 is a circuit diagram showing a first preferred embodiment of the present invention. In FIG. 12, only a circuit construction of an analog value memory circuit which is essential part of the present invention is shown. The analog value memory circuit shown corresponds to the circuit of FIG. 1 which includes the N selection switches S(N) and memory capacitors C(n).

Referring to FIG. 12, memory cells formed from memory capacitors Cmn and selection switches Smn connected in series between row lines RLn and the ground are arranged in a matrix of u columns and v rows. For those u·v memory capacitors C11 to Cuv, writing/reading out of a charge is performed by driving control of the selection switches S11 to Suv with column selection signals X1 to Xu for the X direction and row selection signals Y1 to Yv for the Y direction. The column selection signals X1 to Xu are outputted from an X direction scanning circuit 51, and the row selection signals Y1 to Yv are outputted from a Y direction scanning circuit 52. The X direction scanning circuit 51 and the Y direction scanning circuit 52 are formed, for example, from shift registers.

The analog delay circuit which includes the analog value memory circuit formed from the u·v memory cells (memory capacitors C11 to Cuv and selection switches S11 to Suv) arranged two-dimensionally in a matrix has, in the present embodiment, a construction wherein row switches SY1 to SYv are provided for the individual rows. In particular, one terminal of each of the row switches SY1 to SYv is connected to a common node A serving as an input/output node while the other terminal of the row switches SY1 to SYv is connected to a terminal of a corresponding one of row lines RL1 to RLv. The row switches SY1 to SYv are driven by the column selection signals X1 to Xu outputted from the X direction scanning circuit 51 and the row selection signals Y1 to Yv outputted from the Y direction scanning circuit 52, respectively.

In the analog delay circuit according to the present embodiment having the construction described above, if it is assumed that the ith column and the jth row are selected now, then the column selection signal Xi outputted from the X direction scanning circuit 51 and the row selection signal Yj outputted from the Y direction scanning circuit 52 are both rendered active so that the selection switch Sij in the ith column and the jth row is selected and put into a closed (on) state. Simultaneously, from among the row switches sy1 to SYv, only the row switch SYj for the jth row is selected and put into a closed (on) state.

If the analog value memory circuit side is viewed from the node A in this selection condition, then only the jth row is connected to the node A while the remaining rows, that is, all of the first to j−1th rows and the j+1th to vth rows are disconnected from the node A. As a result, only 1/v of the selection switch group (S11 to Suv) of the u columns and the v rows is connected to the node A. In this instance, since the parasitic capacitances of the column of row switches SY1 to SYv increase newly, the total parasitic capacitance does not reduce simply to 1/V, but becomes substantially equal to 1/V. Consequently, the total parasitic capacitance is substantially reduced compared with that of the related art.

As described hereinabove, since an analog value memory circuit wherein memory capacitors Cmn and selection switches smn for the memory capacitors Cmn are arranged two-dimensionally in a matrix includes row switches SY1 to SYv provided for the individual rows so that the selection switches Smn may be selected divisionally for the individual rows, the parasitic capacitance connected to the node A is a total parasitic capacitance of the selection switches Smn for one row only. Consequently, the capacitance value of the parasitic capacitance can be reduced remarkably compared with that of the related art wherein the parasitic capacitances of all of the selection switches S(N) are connected to the node.

As a result, the problem of the related art that, by an influence of the parasitic capacitance, the feedback ratio of the operational amplifier A1 (refer to FIG. 1) when the charge of the memory capacitors Cmn is read out is reduced remarkably and this reduces any difficulties with high speed reading. Further, since also the amount of unnecessary charge accumulated in the parasitic capacitance almost without being delayed decreases, also disturbance to the output by such unnecessary chargers can be decreased.

Figure 13:
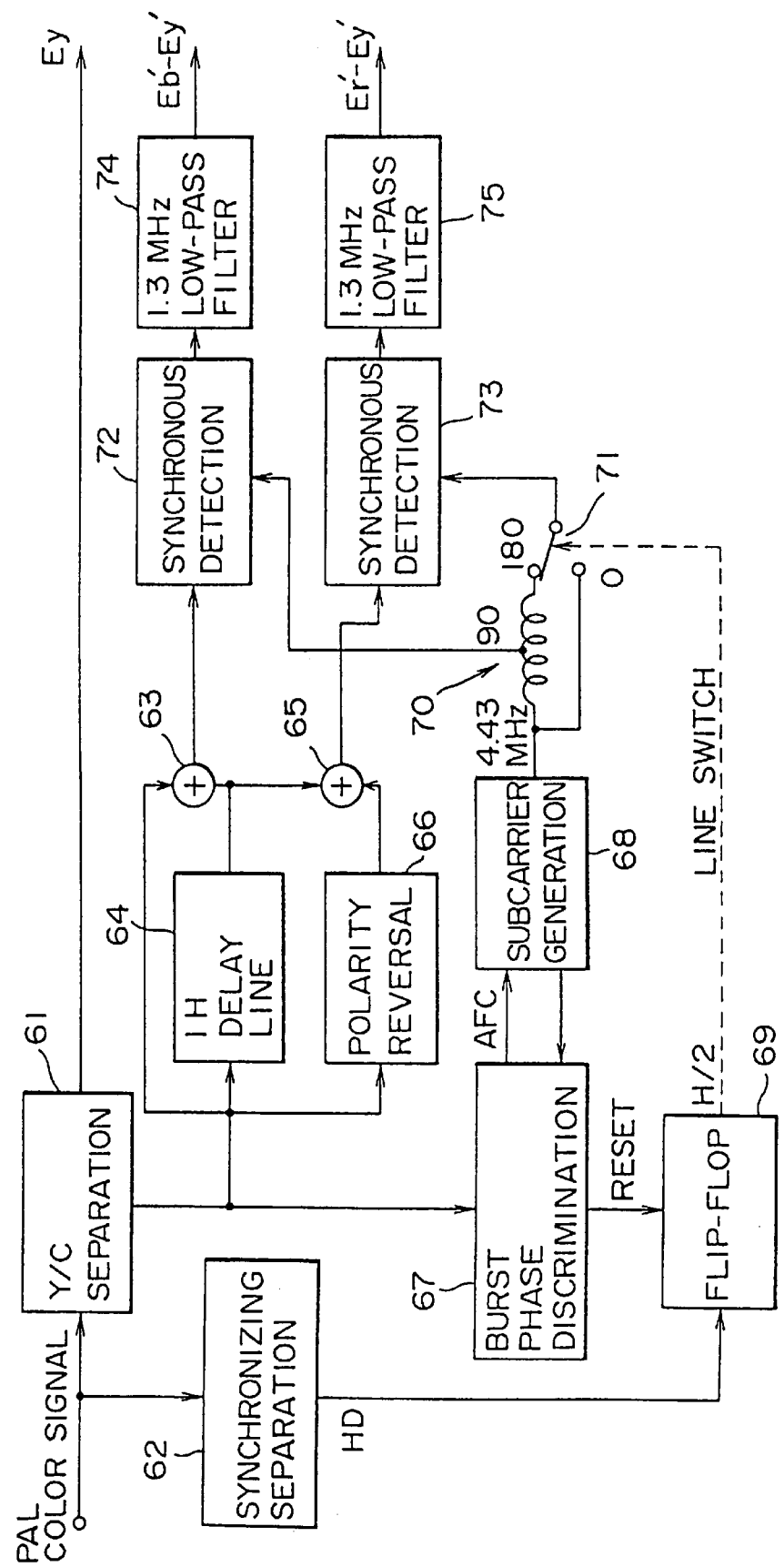
FIG. 13 is a block diagram showing an example of a construction of a color signal demodulation circuit for a color television receiver of the PAL system in which a delay circuit according to the present invention is employed for a 1 H delay line and showing a second preferred embodiment of the present invention.

Subsequently, a second preferred embodiment of the present invention will be described. The analog delay circuit according to the embodiment described above is employed, for example, in a color signal demodulation circuit for a color television receiver of the PAL system. An example of a construction of the color signal demodulation circuit is shown in FIG. 13. Referring to FIG. 13, a color signal of the PAL system is supplied to a Y/C separation circuit 61, by which it is separated into a brightness (Y) signal Er' and a chroma (C) signal. The color signal is applied also to a synchronizing separation circuit 62, by which a horizontal synchronizing signal HD is separated from it. The separated chroma signal is inputted to one of input terminals of an adder 63 and is further inputted to the other input terminal of the adder 63 and one of input terminals of another adder 65 after it is delayed by 1 H by a 1 H delay line 64. The chroma signal is further inputted to the other input terminal of the adder 65 after it is reversed in polarity by a polarity reversal circuit 66.

The chroma signal is supplied also to a burst phase discrimination circuit 67. The burst phase discrimination circuit 67 extracts a burst signal inserted in a back porch of the horizontal synchronizing signal HD and supplies the burst signal to a subcarrier generation circuit 68 and a flipflop 69. The subcarrier generation circuit 68 produces a subcarrier of 4.43 MHz in response to the burst signal. The subcarrier is successively shifted to subcarriers having phase differences of 0 degree, 90 degrees and 180 degrees by a phase shifter 70. Then, the subcarrier of the phase difference of 0 degree and the subcarrier of the phase difference of 180 degrees are outputted alternatively by a change-over switch 71.

The change-over control of the change-over switch 71 is performed by the output of the flipflop 69 which divides the horizontal synchronizing signal HD to ½ in synchronism with the burst signal. Meanwhile, the addition outputs of the adders 63 and 65 are supplied to synchronizing detection circuits 72 and 73, respectively. The synchronizing detection circuit 72 performs detection in synchronism with the subcarrier of the phase difference of 90 degrees while the synchronizing detection circuit 73 performs detection in synchronism with the subcarrier of the phase difference of 0 degree or 180 degrees. The detection output of the synchronizing detection circuit 72 passes through a low-pass filter 74 of 1.3 MHz to make a color difference signal Eb'–Ey'. The detection output of the synchronizing detection circuit 73 passes through another low-pass filter 75 of 1.3 MHz to make another color difference signal Er'–Ey'.

In the color signal demodulation circuit for a color television receiver of the PAL system described above, line correlation is taken using the 1 H delay line 64 to effect correction for a DP (differential phase) error, that is, a hue distortion, produced in a transmission line or inside of the receiver. In the color signal demodulation circuit, the analog delay circuit according to the present embodiment is used as the 1 H delay line 64. Since the analog delay circuit according to the present embodiment includes an analog value memory circuit of the circuit construction wherein writing/reading out of charge is performed for memory capacitors arranged two-dimensionally in a matrix, it is possible to form the analog delay circuit in an integrated relationship with a color signal demodulation circuit on a chip for the color signal demodulation circuit.

It is to be noted that the application of the analog delay circuit according to the present embodiment is not limited to that wherein a color signal is delayed by 1 H in a color signal demodulation circuit for a color television receiver of the PAL system, and the analog delay circuit can be applied also to a circuit which delays a brightness signal by 1 H or which is used as a delay circuit for an audio signal.

Subsequently, a detailed embodiment of an analog value memory circuit according to a third or fourth preferred embodiment of the present invention wherein a MOSFET or a JFET is used as a switch element will be described.

Figure 14:
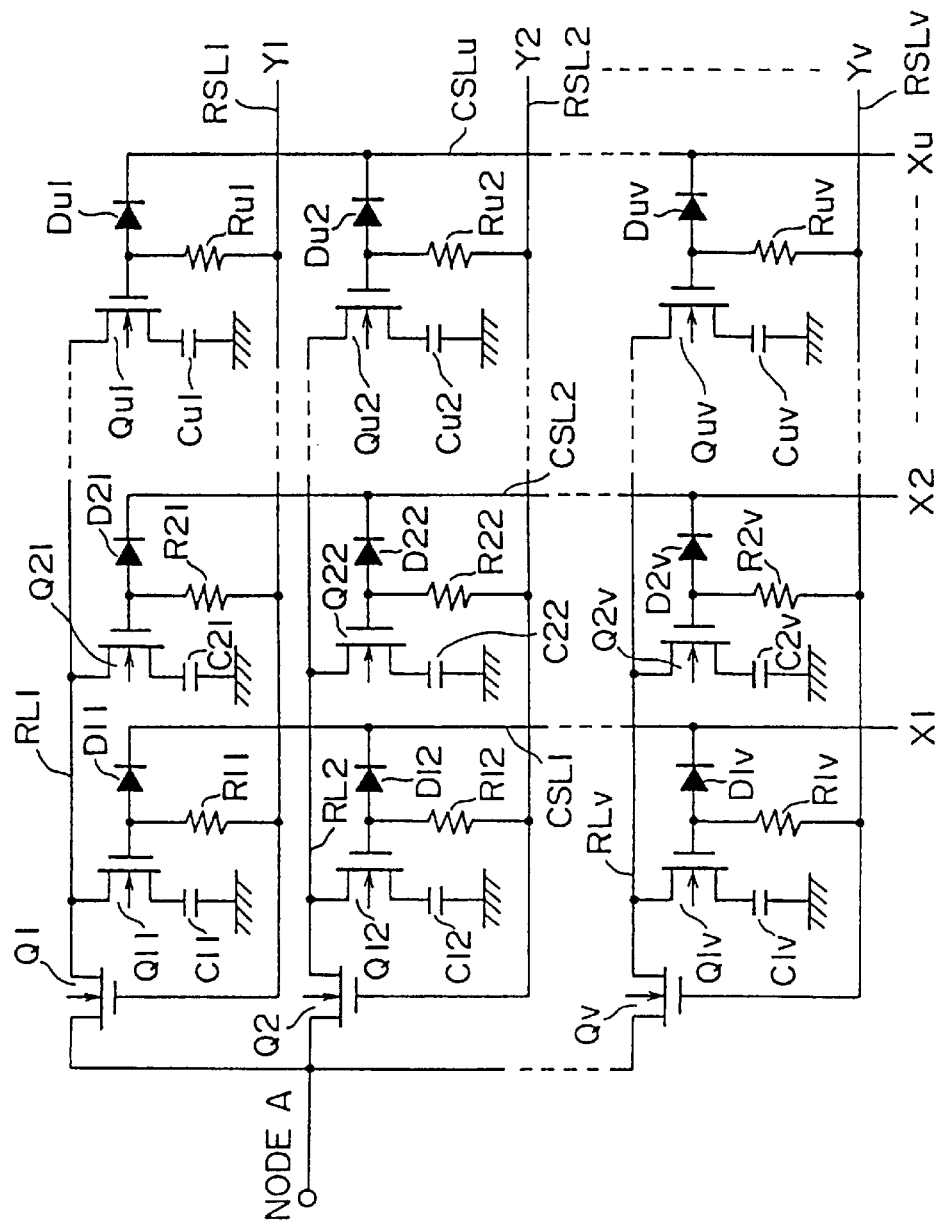
FIG. 14 is a detailed circuit diagram of an analog delay circuit showing a third preferred embodiment of the present invention.

FIG. 14 is a circuit diagram showing the third embodiment wherein a MOSFET is used as the switch element. Referring to FIG. 14, n-channel MOSFETs Q1 to Qv are used for the row switches SY1 to SYv, and the drains of the MOSFETs Q1 to Qv are connected to a node A while the sources are connected to one terminals of the row lines RL1 to RLv, respectively. Further, the gates of the MOSFETs Q1 to Qv are connected to row selection lines RSL1 to RSLv, respectively. Thus, row selection signals Y1 to Yv are applied to the gates of the MOSFETs Q1 to Qv via the row selection lines RSL1 to RSLv, respectively.

In the first row, the drains of n-channel MOSFETs Q11 to Qu1 as selection switches are connected to the row line RL1. One terminals of the memory capacitors C11 to Cu1 are connected to the sources of the MOSFETs Q11 to Qu1, and the other terminals of the memory capacitors C11 to Cu1 are grounded. The anodes of diodes D11 to Du1 and one terminals of resistors R11 to Ru1 are connected to the gates of the MOSFETs Q11 to Qu1, respectively. The cathodes of the diodes D11 to Du1 are connected to column selection lines CSL1 to CSLu, respectively, and the other terminals of the resistors R11 to Ru1 are connected to the row selection lines RSL1 to RSLv, respectively.

Also in the second row, the drains of the MOSFETs Q12 to Qu2 are connected to the row line RL2 in a manner similar to MOSFETs Q11 to Qu1. One terminals of the memory capacitors C12 to Cu2 are connected to the sources of the MOSFETs Q12 to Qu2, respectively, and the other terminals of the memory capacitors C12 to Cu2 are grounded. The anodes of the diodes D12 to Du2 and one terminals of the resistors R12 to Ru2 are connected to the gates of the MOSFETs Q12 to Qu2, respectively. The cathodes of the diodes D12 to Du2 are connected to the column selection lines CSL1 to CSLu, respectively, and the other terminals of the resistors R12 to Ru2 are connected to the row selection lines RSL1 to RSLv, respectively.

Further, also in the vth row, the drains of the n-channel MOSFETs Q1v to Quv are connected to the row line RLv similarly. One terminals of the memory capacitors C1v to Cuv are connected to the sources of the MOSFETs Q1v to Quv, respectively, and the other terminals of the memory capacitors C1v to Cuv are grounded. The anodes of the diodes D1v to Duv and one terminals of the resistors R1v to Ruv are connected to the gates of the MOSFETs, Q1v to Quv, respectively. The cathodes of the diodes D1v to Duv are connected to the column selection lines CSL1 to CSLu, respectively, and the other terminals of ths resistors R1v to Ruv are connected to the row selection lines RSL1 to RSLv, respectively.

Circuit operation of the analog delay circuit having the construction described above when, for example, the memory capacitor C11 is selected will be examined. In this instance, in the X direction, only the column selection signal X1 has a high potential while the others have a low potential. Meanwhile, in the Y direction, only the row selection signal Y1 has a high potential while the others have a low potential. Since the MOSFETs Qij which serve as selection switches are controlled at the gates thereof by signals of a matrix formed from the diodes Dij and the registers Rij, the gate of the MOSFET Q11 exhibits a high potential and the MOSFET Q11 is placed into an on-state, and consequently, the memory capacitor C11 is selected.

Simultaneously with this, the MOSFET row switch Q1 in the row switch column of the MOSFETs Q1 to Qv is driven directly by the row selection signal Y1. Consequently, since only the MOSFET Q1 which is a row switch for the first row is put into an on-state, only the drains of the MOSFETs Q11 to Qu1 which are the selection switches of the first row are connected to the node A via the MOSFET row switch Q1.

Figure 15:
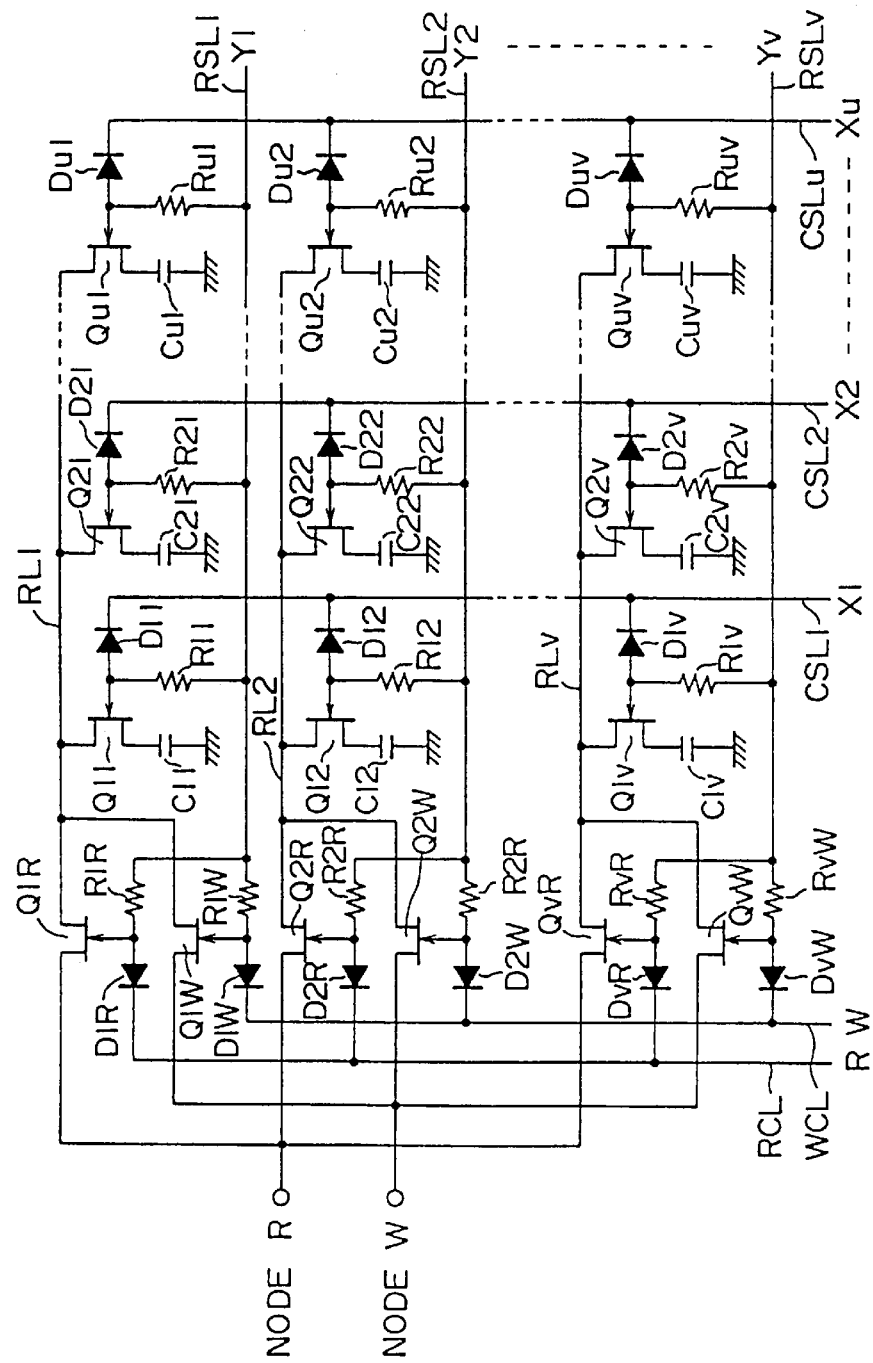
FIG. 15 is a circuit diagram of an analog delay circuit showing a fourth preferred embodiment of the present invention.

FIG. 15 is a circuit diagram showing the fourth embodiment wherein a JFET is used as a switch element. In the present fourth embodiment, read switches and write switches are provided as the row switches SY1 to SYv, and n-channel JFETs Q1R to QvR and Q1W to QvW are used as the switches.

In particular, referring to FIG. 15, the drains of the read JFETs Q1R to QvR are connected to a node R, and the sources of them are connected to one terminals of row lines RL1 to RLv. The anodes of diodes D1R to DvR and one terminals of resistors R1R to RvR are connected to the gates of the JFETS Q1R to QvR, respectively. The cathodes of the diodes D1R to DvR are connected to a read control line RCL, and the other terminals of the resistors R1R to RvR are connected to row selection lines RSL1 to RSLv, respectively.

Similarly, the drains of the write JFETs Q1W to QvW are connected to a node W, and the sources of them are connected one terminals of the row lines RL1 to RLv, perceptively. The anodes of diodes D1W to DvW and one terminals of resistors R1W to RvW are connected to the gates of the JFETs Q1W to QvW, respectively. The cathodes of the diodes D1W to DvW are connected to a write control line WCL, and the other terminals of the resistors R1W to RvW are connected to the row selection lines RSL1 to RSLv, respectively.

In the first row, the drains of n-channel JFETs Q11 to Qu1 which serve as selection switches are connected to the row line RL1. One terminals of the memory capacitors C11 to Cu1 are connected to the sources of the JFETs Q11 to Qu1, respectively, and the other terminals of the memory capacitors C11 to Cu1 are grounded. The anodes of the diodes D11 to Du1 and one terminals of the resistors R11 to Ru1 are connected to the gates of the JFETs Q11 to Qu1, respectively. The cathodes of the diodes D11 to Du1 are connected to the column selection lines CSL1 to CSLu, respectively, and the other terminals of the resistors R11 to Ru1 are connected to the row selection lines RSL1 to RSLv, respectively.

Also in the second row, the drains of n-channel JFETs Q12 to Qu2 which serve as selection switches are connected to the row line RL2 similarly. One terminals of the memory capacitors C12 to Cu2 are connected to the sources of the JFETs Q12 to Qu2, respectively, and the other terminals of the memory capacitors C12 to Cu2 are grounded. The anodes of the diodes D12 to Du2 and one terminals of the resistors R12 to Ru2 are connected to the gates of the JFETs Q12 to Qu2, respectively. The cathodes of the diodes D12 to Du2 are connected to the column selection lines CSL1 to CSLu, respectively, and the other terminals of the resistors R12 to Ru2 are connected to the row selection lines RSL1 to RSLv, respectively.

Also in the vth row, the drains of n-channel JFETs Q1v to Quv which serve as selection switches are connected to the row line RLv similarly. One terminals of the memory capacitors C1v to Cuv are connected to the sources of the JFETs Q1v to Quv, respectively, and the other terminals of the memory capacitors C1v to Cuv are grounded. The anodes of the diodes D1v to Duv and one terminals of the resistors R1v to Ruv are connected to the gates of the JFETs Q1v to Quv, respectively. The cathodes of the diodes D1v to Duv are connected to the row selection lines CSL1 to CSLu, respectively, and the other terminals of the resistors R1v to Ruv are connected to the row selection lines RSL1 to RSLv, respectively.

Where the construction wherein the row switches SY1 to SYv are divided into the read JFETs Q1R to QvR and the write JFETs Q1W to QvW and the switches are driven by matrix diving control with the write signal W and the read signal R as well as the row selection signals Y1 to Yv for the Y direction as described above is applied to the circuit of FIG. 1, it can be considered that it integrates the functions of the selection switches S(N) for the memory capacitors C(n), the write switch S1 and the read switch S2.

Further, where a JFET is used for a switch element, the circuit can be produced by a bipolar process almost without any additional step. Besides, also the effect that it can be formed in the same step as that for a high current amplification ratio transistor (so-called LEC transistor) is achieved.

It is to be noted that the construction wherein the row switches SY1 to SYv are divided into row switches for reading out and row switches for writing is not limited to a circuit wherein a JFET is used as a switch element, but can naturally be applied similarly to another circuit wherein a MOSFET is used as a switch element as described above in connection with the first embodiment or a further circuit wherein a bipolar transistor is used as a switch circuit.

Figure 16:
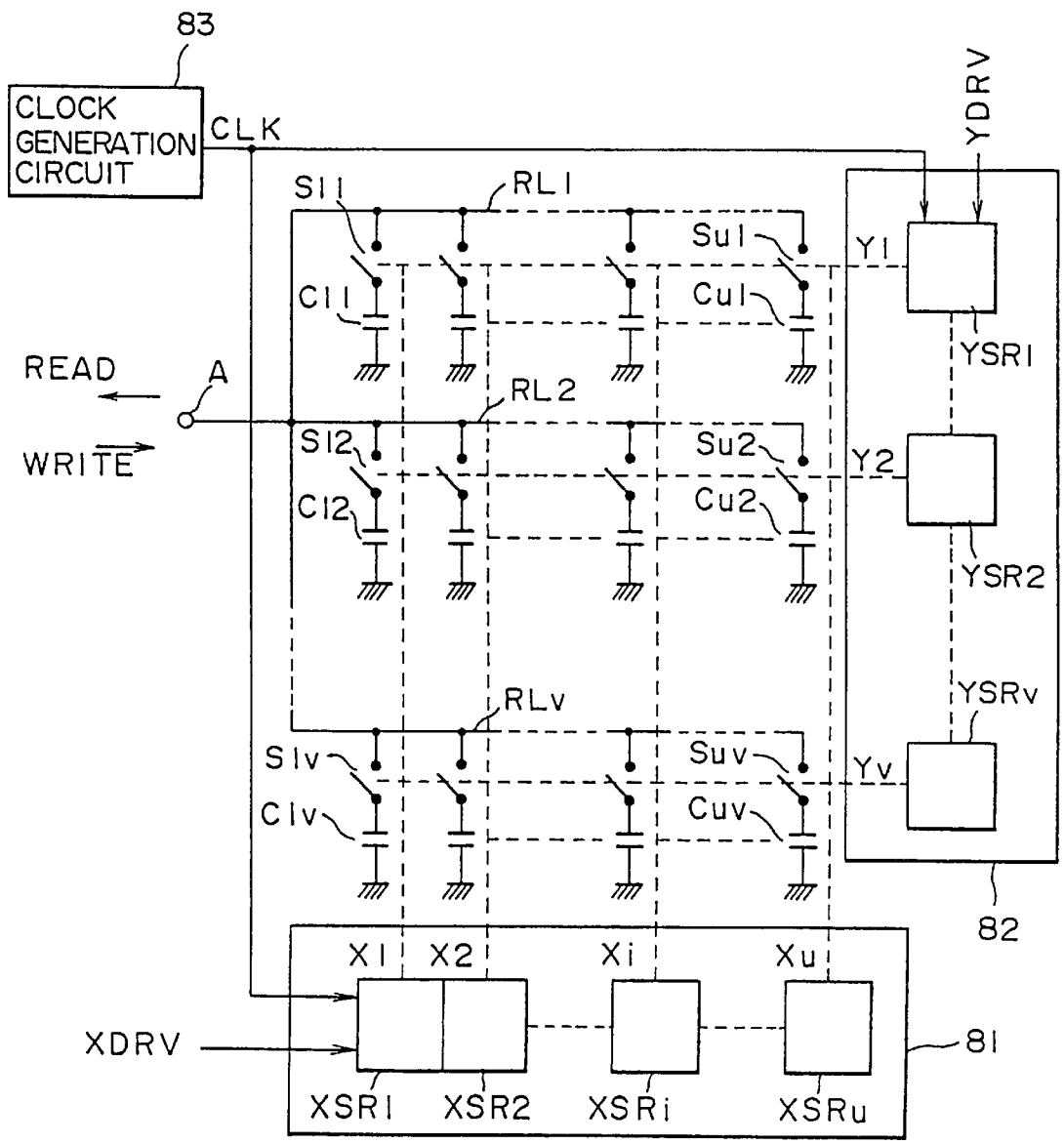
FIG. 16 is a circuit diagram of an analog delay circuit showing a fifth preferred embodiment of the present invention.

Subsequently, an analog delay circuit according to a fifth preferred embodiment of the present invention will be described. In FIG. 16, only a circuit construction of an analog value memory circuit which is an essential part of the present invention is shown. The analog value memory circuit shown corresponds to the circuit of FIG. 1 which includes the N selection switches S(N) and memory capacitors C(n).

Referring to FIG. 16, memory cells formed from selection switches Smn and memory capacitors Cmn connected in series between row lines RLn and the ground, respectively, are arranged in a matrix of u columns and v rows. In particular, in the memory cells of the first row, one terminals of selection switches S11 to Su1 are connected to an input/output node A via the row line RL1, and memory capacitors C11 to Cu1 are connected between the other terminals of the selection switches S11 to Su1 and the ground.

Also in the memory cells of the second row, one terminals of the selection switches S12 to Su2 are connected to the input/output node A via the row line RL2, and memory capacitors C12 to Cu2 are connected between the other terminals of the selection switches S12 to Su2 and the ground. Further, also in the memory cells of the vth row, one terminals of the selection switches S1v to Suv are connected to the input/output node A via the row line RLv, and memory capacities C1v to Cuv are connected between the other terminals of the selection switches S1v to Suv and the ground.

The u·v selection switches S11 to Suv can be formed from MOSFETs, JFETs or bipolar transistors similarly as in the related art. writing/reading out of charge is performed for the u·v memory capacitors C11 to Cuv by driving control of the selection switches S11 to Suv with column selection signals X1 to Xu for the X direction and row selection signals Y1 to Yu for the Y direction. The column selection signals X1 to Xu are outputted from an X direction scanning circuit 81 while the row selection signals Y1 to Yv are outputted from a Y direction scanning circuit 82.

The X direction scanning circuit 81 is formed from u stages of shift registers XSR1 to XSRu the number of which is equal to the number u of columns of the cell matrix. Meanwhile, the Y direction scanning circuit 82 is formed from v stages of shift registers YSR1 to YSRv the number of which is equal to the number v of rows of the cell matrix. A clock signal CLK generated by a clock generation circuit 83 is supplied directly to the X direction scanning circuit 81 and the Y direction scanning circuit 82. In other words, the two scanning circuits 81 and 82 are driven by the same (i.e., equal) clock frequency.

In the X direction scanning circuit 81 and the Y direction scanning circuit 82, the number u of the shift registers XSR1 to XSRu and the number v of the shift registers YSR1 to YSRv corresponding to the numbers u and v of columns and rows of the cell matrix are set so that they have no common divisor other than 1.

Figure 17:
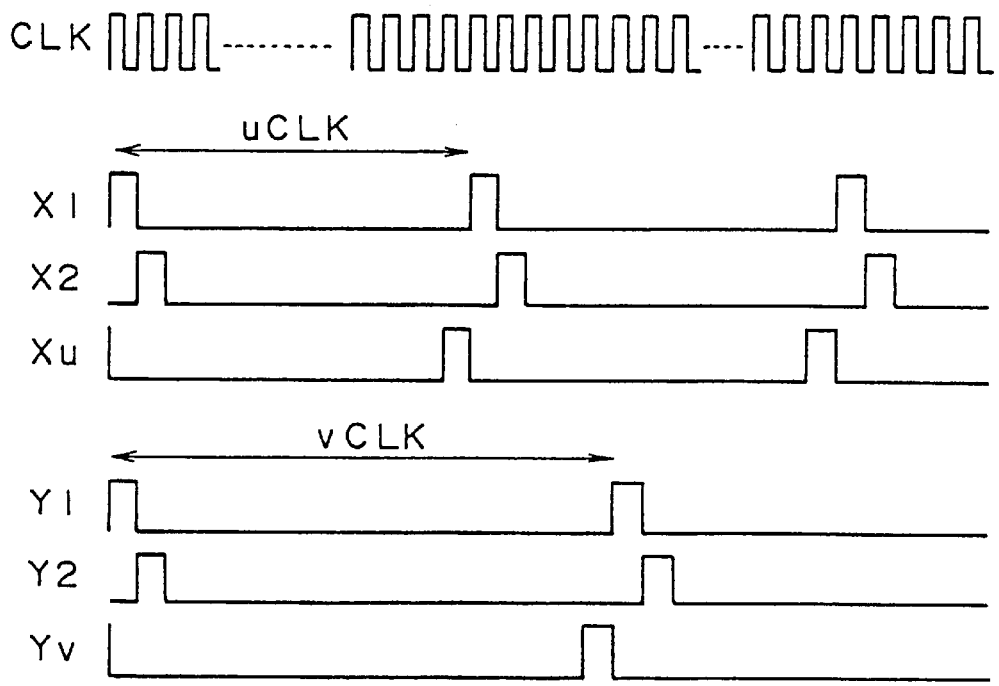
FIG. 17 is a waveform diagram illustrating operation of an analog value memory circuit shown in FIG. 16.

FIG. 17 shows operation waveforms of the analog value memory circuit of the construction described above. Referring to FIG. 17, CLK denotes a clock signal common to the X direction scanning circuit 81 and the Y direction scanning circuit 82, X1, X2 and Xu denote column selection signals for the first, second and uth columns, respectively, and Y1, Y2 and Yv are row selection signals for the first, second and vth rows, respectively. The column selection signals X1 to Xu repetitively appear after each u clock signals CLK whereas the row selection signals Y1 to Yv repetitively appear after each v clock signals CLK. The column selection signal Xi and the row selection signal Yi are clock signals shifted by one clock from the column selection signal Xi-1 and the row selection signal Yi-1, respectively.

Subsequently, a sixth embodiment of the present invention will be described.

Figure 10:
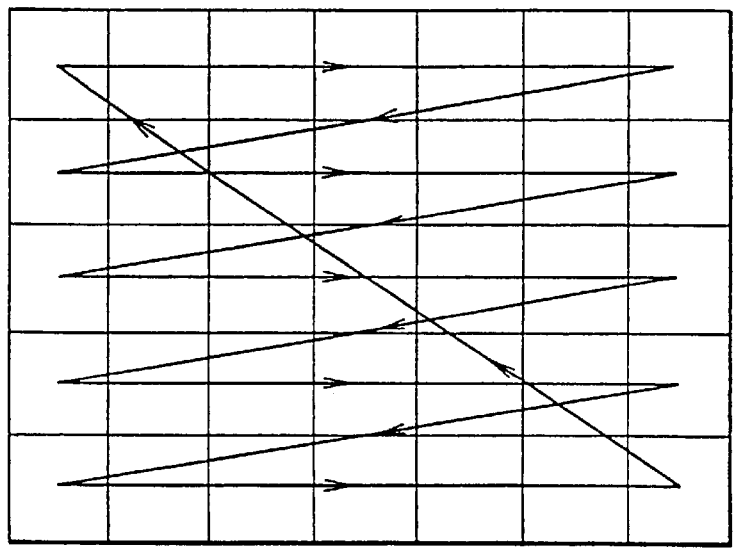
FIG. 10 is a diagrammatic view illustrating a concept of a scanning method of a related art.
Figure 18:
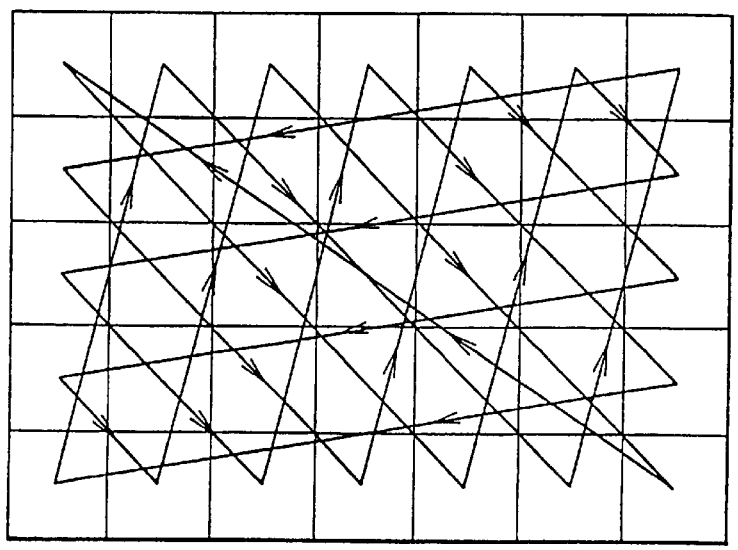
FIG. 18 is a diagrammatic view illustrating a concept of a scanning method according to a sixth preferred embodiment of the present invention.

As described above, where the X direction scanning circuit 81 and the Y direction scanning circuit 82 are driven with an equal clock frequency and the numbers u and v of the registers are set so that they have no common divisor other than 1, the addresses in both of the X and Y directions vary for every one clock. Consequently, where a cell matrix of, for example, u=7 columns and v=5 rows is taken as an example, the scanning is not such raster scanning as of television scanning signals refer to FIG. 10), but is such that all memory cells are scanned in accordance with a certain rule as seen from arrow marks in FIG. 18.

Figure 5:
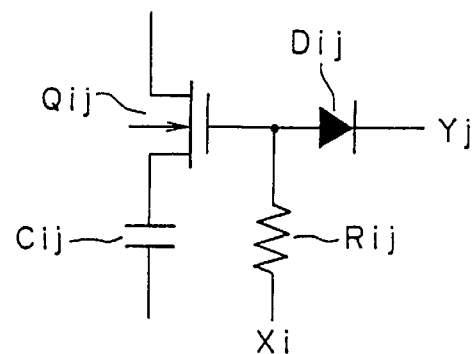
FIG. 5 is a circuit diagram showing an example of a related art of a construction of memory cells where a MOSFET is employed as a selection switch.
Figure 6:
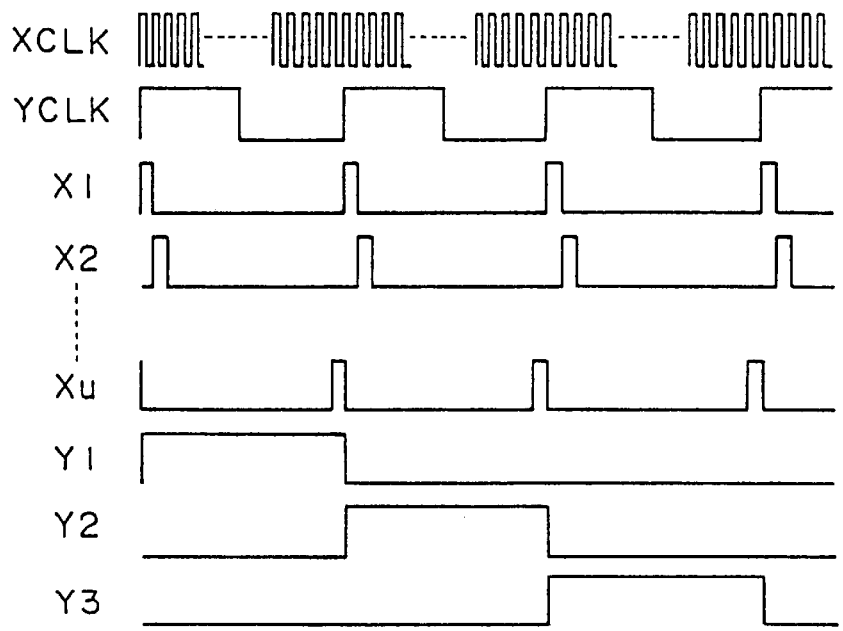
FIG. 6 is a waveform diagram illustrating operation of an analog value memory circuit according to a related art.
Figure 7:
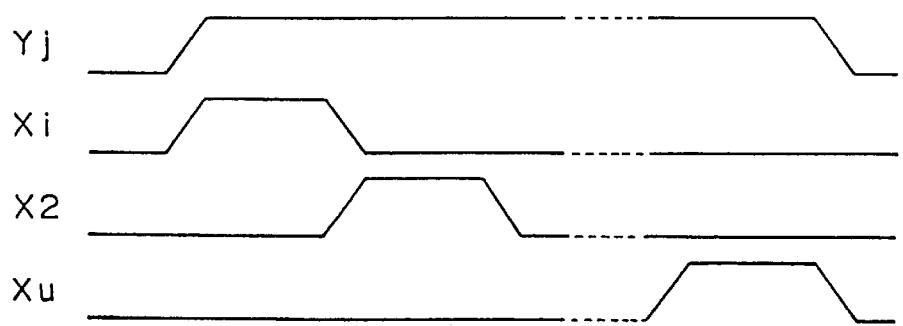
FIG. 7 is an enlarged waveform diagram of row and column selection signals.
Figure 8:
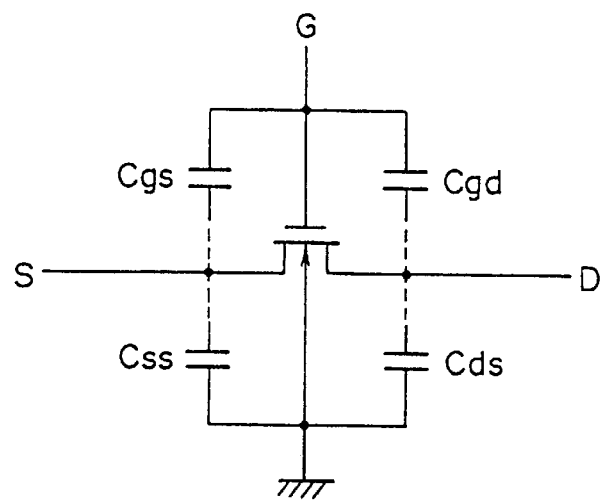
FIG. 8 is a circuit diagram illustrating parasitic capacitances of a MOSFET.
Figure 9:
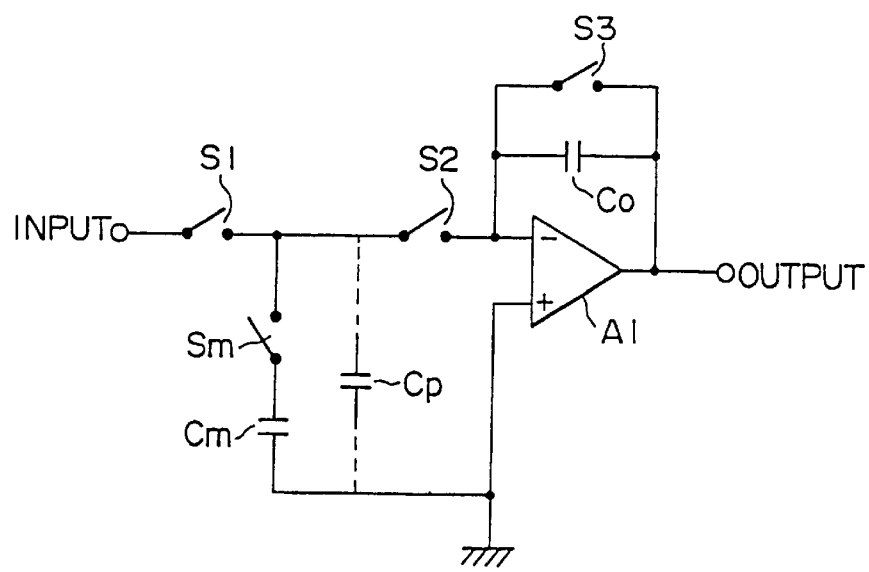
FIG. 9 is a circuit diagram of an analog delay circuit of a related art which includes a parasitic capacitance.

As a result, in FIG. 5 which shows the construction of a memory cell wherein a MOSFET is used as a selection switch, the column selection signal Xi and the row selection signal Yj have a one clock width for any of the memory cells and give a same selection condition to all of the memory cells, and consequently, production of fixed pattern noise which is a subject of the related art is prevented. The essential requirement for the present embodiment is that the column number u and the row number v have no common divisor as described hereinabove, and it is necessary to select the column number u and the row number v as such. Where, for example, the case of u=v is examined, it can be estimated readily that the arrangement does not function since memory cells on only diagonal lines of the cell matrix are accessed while the other memory cells are not accessed.

Figure 19:
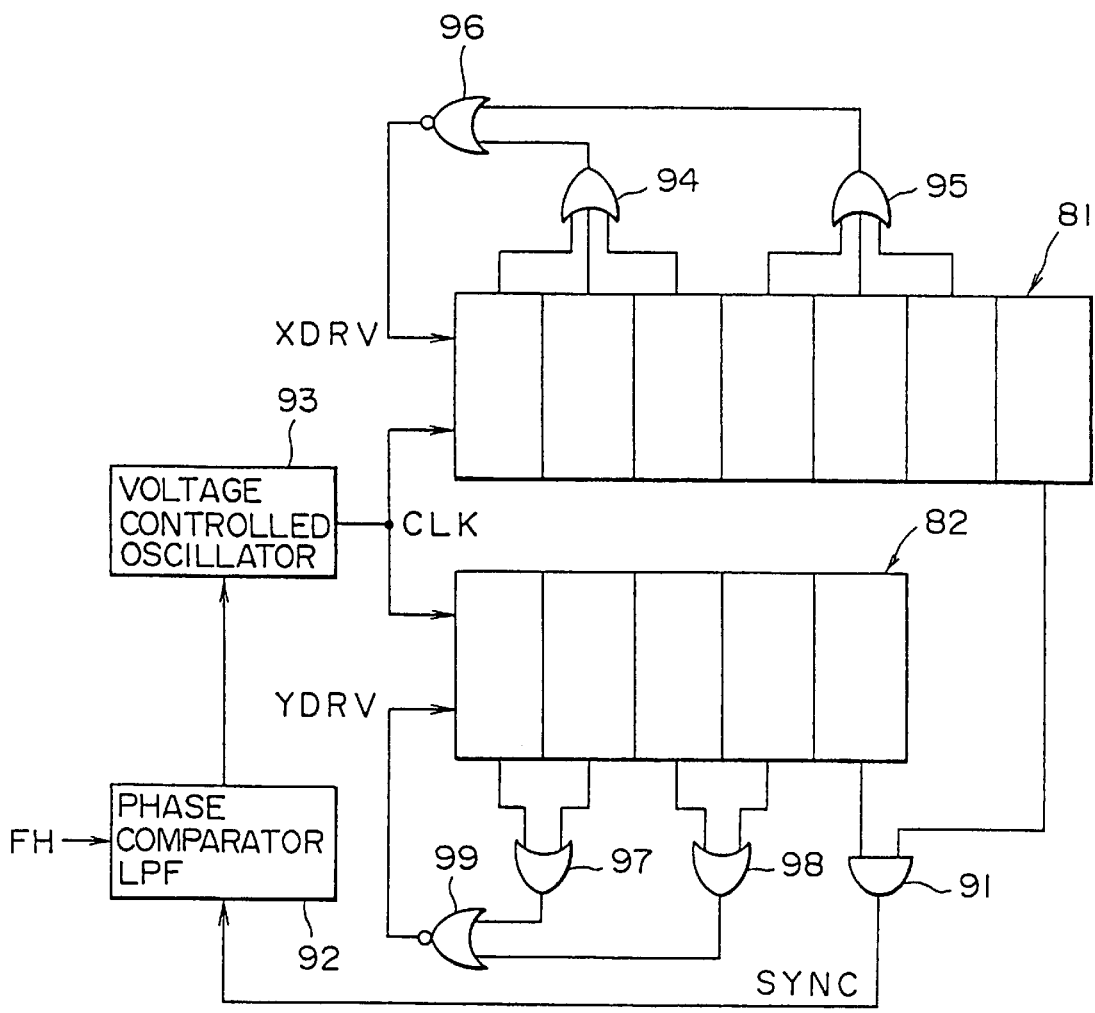
FIG. 19 is a block diagram of a clock generation circuit showing a seventh preferred embodiment of the present invention.

Subsequently, the clock generation circuit 83 for generating the clock signal CLK common to the X direction scanning circuit 81 and the Y direction scanning circuit 82, which is a seventh preferred embodiment of the present invention, will be described. FIG. 19 is a block diagram showing the clock generation circuit according to the seventh embodiment of the present invention. It is to be noted that, in the present embodiment, an arrangement wherein the number of stages of shift registers of the X direction scanning circuit 81 is 7 (u=7) and the number of stages of shift registers of the Y direction scanning circuit 82 is 5 (v=5) is shown as an example.

Referring to FIG. 19, an output signal (column selection signal) of the last stage of the X direction scanning circuit 81 is inputted to one of input terminals of an AND circuit 91 while an output signal (row selection signal) of the last stage of the Y direction scanning circuit 82 is inputted to the other input terminal of the AND circuit 91. The output signal of the AND circuit 91 is supplied as a synchronizing frequency SYNC to a phase comparator 92. The phase comparator 92 compares the phase of a horizontal synchronizing frequency FH supplied thereto from the outside with the phase of the synchronizing frequency SYNC outputted from the AND circuit 91 and supplies an output corresponding to the phase difference as a control input to a voltage controlled oscillator 93. The voltage controlled oscillator 93 has an oscillation frequency which varies in response to the phase difference output of the phase comparator 92. Then, the oscillation frequency makes the clock signal CLK common to the X direction scanning circuit 81 and the Y direction scanning circuit 82.

Meanwhile, output signals of the other stages of the X direction scanning circuit 81 than the last state are inputted to a NOR circuit 96 via OR circuits 94 and 95, and the output signal of the NOR circuit 96 is supplied as a transfer pulse signal XDRV to the first stage of the X direction scanning circuit 81. output signals of the other stages of the Y direction scanning circuit 82 than the last stage are inputted to a NOR circuit 99 via OR circuits 97 and 98, and the output signal of the NOR circuit 99 is supplied as a transfer pulse signal YDRV to the first stage of the Y direction scanning circuit 82. Consequently, if the output signals of all stages except the last stage exhibit a low level, then a high level is returned to the first stage, and only one output from among all stages exhibits a high level.

In the clock generation circuit according to the present embodiment having the construction described above, the output signal of the last stage of the X direction scanning circuit 81 is a pulse signal having a frequency equal to 1/u (in the present embodiment, u=7) that of the clock signal CLK. The output of the last stage of the Y direction scanning circuit 82 is a pulse signal having a frequency equal to 1/v (in the present embodiment, v=5) of the clock signal CLK. After each least common multiple of u and v, in particular, if u and v include no common divisor, after each u×v clocks CLK, a pulse is outputted from the AND circuit 91. After all, phase locking is established so that the voltage controlled oscillator 93 may oscillate with an oscillation frequency of u×v×FH.

Figure 11:
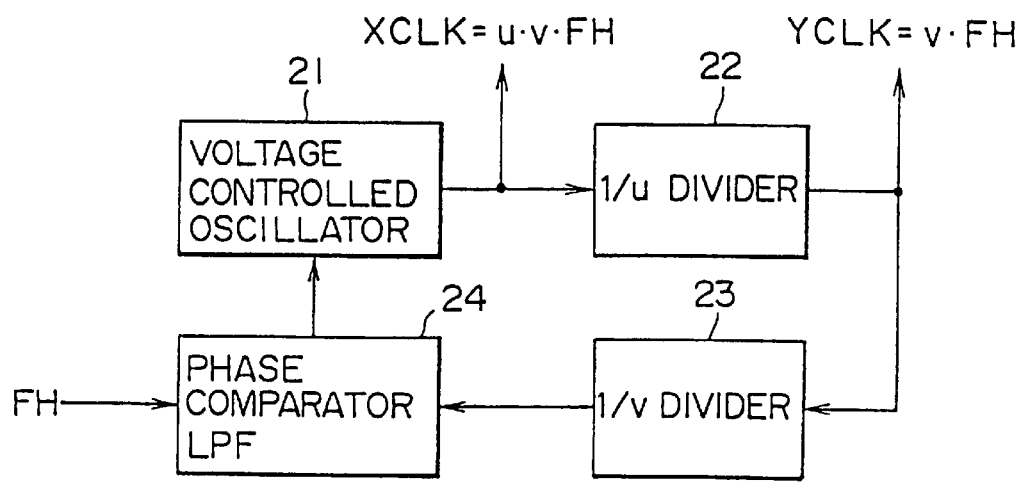
FIG. 11 is a block diagram of a clock generation circuit of a related art.

Accordingly, by adopting a PLL circuit construction wherein the output of the last stage of the X direction scanning circuit 81 and the output of the last stage of the Y direction scanning circuit 82 are logically ANDed and the phase of the logical AND output is compared with the phase of the horizontal synchronizing frequency FH by the phase comparator 92 using the logical AND output as the synchronizing frequency SYNC and then the oscillation frequency of the voltage controlled oscillator 93 is controlled in accordance with the phase difference as described above, the X direction scanning circuit 81 and the Y direction scanning circuit 82 act as a divider which divides the oscillation frequency of the voltage controlled oscillator 93, and consequently, the divider and so forth of FIG. 11 which are required by the related art become unnecessary at all. Consequently, where the present clock generation circuit is formed as an IC, the occupied area on a chip or the current consumption thereof can be reduced.

It is to be noted that, while, in the present embodiment, the output of the last stage of the X direction scanning circuit 81 and the output of the last stage of the Y direction scanning circuit 82 are logically ANDed, the outputs to be logically ANDed are not limited to the outputs of the last stages, but the outputs of any stages may be logically ANDed. Also in this instance, similar effects to those of the embodiment described above can be achieved.

Further, while the present embodiment is described by way of an example wherein u and v are set to u=7 and v=5, respectively, where it is used as a 1 H delay circuit for an actual color signal demodulation circuit of the PAL system, for example, u and v may be set to 11×15. This is because a sampling frequency higher than 2 MHz is required to pass a color signal of several hundreds kHz.

As described above, according to the present invention, since an analog delay circuit including an analog value memory circuit wherein a plurality of memory cells each including a memory capacitor and a switch element are arranged in a matrix of u columns and v rows includes a plurality of row switches provided for the individual rows and each driven by a row selection signal, the parasitic capacitance connected to an input/output node in a selection condition of the memory cells is equal to a total parasitic capacitance of the switch elements for one row, and the capacitance value is reduced remarkably compared with that of the related art. Consequently, the influence of the parasitic capacitance can be reduced and high speed read out of charge accumulated in the memory capacitors can be achieved. Further, also disturbance by unnecessary charge accumulated in the parasitic capacitance can be reduced.

Meanwhile, in another analog delay circuit according to the present invention, since scanning circuits for two directions are driven with a same clock frequency and the numbers of stages of the scanning circuits are set so that they have no common divisor other than 1, when memory cells are to be selectively scanned, a same selection condition can be applied to all of the memory cells without relying upon the positions of the memory cells. Consequently, production of fixed pattern noise which arises from the fact that different selection conditions are applied can be prevented.

Further, in a clock generation circuit according to the present invention, since a PLL circuit construction wherein individual output signals of two scanning circuits for two directions are logically operated and the phase of the operation output signal is compared with the phase of an external reference signal and then the oscillation frequency of a voltage controlled oscillator for generating a clock signal common to the scanning circuits for two directions is controlled in response to the phase difference, the scanning circuits act as a divider which divides the oscillation frequency of the voltage controlled oscillator. Consequently, a divider and so forth become unnecessary and simplification in circuit construction can be anticipated.

Having now fully described the invention, it will be apparent to one of ordinary skill in the art that many changes and modifications can be made thereto without departing from the spirit and scope of the invention as set forth herein.

What is claimed is:

1. A clock generation circuit for an analog delay circuit which includes an analog memory circuit including a plurality of memory cells each including a switch element having a first terminal connected to a corresponding row line and a memory capacitor connected to a second terminal of said switch element, said memory cells being arranged in a matrix of u columns and v rows, u and v being natural numbers, a first scanning circuit for successively outputting u column selection signals to drive the switch elements of said memory cells for the individual columns, and a second scanning circuit for successively outputting v row selection signals to drive the switch elements of said memory cells for the individual rows, said clock generation circuit supplying a same clock signal to said first and second scanning circuits, said clock generation circuit comprising:

a logic operation circuit for logically operating one of the column selection signals of said first scanning circuit and one of the row selection signals of said second scanning circuit;

a phase comparator for comparing a phase of an output signal of said logical operation circuit and a phase of a reference signal provided from the output with each other; and a voltage controlled oscillator for receiving a comparison output of said phase comparator as a control input for an oscillation frequency and supplying a clock signal of the oscillation frequency commonly to said first and second scanning circuits.

2. The clock generation circuit according to claim 1, wherein said first scanning circuit includes u stages of shift registers, and said second scanning circuit includes v stages of shift registers.

3. The clock generation circuit according to claim 1, wherein said phase comparator compares a phase of an output signal of said logical operation circuit and a phase of a horizontal synchronizing signal of a video signal with each other.

* * * * *